(12) United States Patent
Reynov et al.

(10) Patent No.: US 11,412,610 B2
(45) Date of Patent: Aug. 9, 2022

(54) APPARATUS, SYSTEM, AND METHOD FOR MITIGATING THE SWISS CHEESE EFFECT IN HIGH-CURRENT CIRCUIT BOARDS

(71) Applicant: Juniper Networks, Inc., Sunnyvale, CA (US)

(72) Inventors: Boris Reynov, Sunnyvale, CA (US); David K. Owen, Sunnyvale, CA (US); Michael Clifford Freda, Sunnyvale, CA (US); Steve M. Wilkinson, Sunnyvale, CA (US); Jing Zhang, Sunnyvale, CA (US)

(73) Assignee: Juniper Networks, Inc, Sunnyvale, CA (US)

( * ) Notice: Subject to any disclaimer, the term of this patent is extended or adjusted under 35 U.S.C. 154(b) by 0 days.

(21) Appl. No.: 17/088,623

(22) Filed: Nov. 4, 2020

(65) Prior Publication Data
US 2022/0141952 A1 May 5, 2022

(51) Int. Cl.
*H05K 1/02* (2006.01)
*H05K 3/46* (2006.01)

(52) U.S. Cl.
CPC ......... *H05K 1/0298* (2013.01); *H05K 1/0218* (2013.01); *H05K 3/4641* (2013.01); *H05K 2201/093* (2013.01); *H05K 2201/09309* (2013.01)

(58) Field of Classification Search
CPC ........... H05K 1/0298; H05K 2201/093; H05K 2201/09309; H05K 1/0222; H05K 1/0245; H05K 1/0287; H05K 1/03; H05K 1/113; H05K 1/185; H05K 1/114; H05K 3/3436; H05K 1/0218; H01L 23/49822; H01L 23/49827; H01L 2924/15311
See application file for complete search history.

(56) References Cited

U.S. PATENT DOCUMENTS

| | | | | |
|---|---|---|---|---|
| 6,175,088 B1 * | 1/2001 | Saccocio | ............... | H05K 1/113 174/255 |
| 7,626,828 B1 * | 12/2009 | Alexander | ........... | H05K 1/0234 361/763 |
| 2003/0196832 A1 * | 10/2003 | Peterson | .............. | H05K 1/0298 174/255 |
| 2004/0136168 A1 * | 7/2004 | Duxbury | ................ | H05K 1/112 361/748 |
| 2006/0055049 A1 * | 3/2006 | Nelson | ................... | H05K 1/115 257/E23.079 |
| 2008/0093726 A1 * | 4/2008 | Preda | ...................... | H01L 23/50 257/700 |
| 2009/0147489 A1 * | 6/2009 | Togashi | ................ | H01G 4/232 361/777 |

(Continued)

*Primary Examiner* — Steven T Sawyer
(74) *Attorney, Agent, or Firm* — FisherBroyles, LLP

(57) ABSTRACT

A disclosed apparatus may be a circuit board that includes (1) a first unique sublaminate that includes a plurality of ground layers and a plurality of signal layers, (2) a second unique sublaminate that includes a plurality of power layers and another plurality of signal layers, and (3) a symmetry axis that bisects the circuit board between the first unique sublaminate and the second unique sublaminate, wherein the first unique sublaminate and the second unique sublaminate are distinct from one another. Various other apparatuses, systems, and methods are also disclosed.

14 Claims, 6 Drawing Sheets

(56) References Cited

U.S. PATENT DOCUMENTS

| | | | |
|---|---|---|---|
| 2009/0173520 A1* | 7/2009 | Duong | H05K 1/0216 |
| | | | 174/250 |
| 2012/0235141 A1* | 9/2012 | Masubuchi | H01L 23/552 |
| | | | 257/48 |
| 2018/0376590 A1* | 12/2018 | Xiong | H05K 1/185 |

* cited by examiner

APPARATUS, SYSTEM, AND METHOD FOR MITIGATING THE SWISS CHEESE EFFECT IN HIGH-CURRENT CIRCUIT BOARDS

BACKGROUND

In today's world of vast computing technology, telecommunications devices are continually evolving to meet customers' needs and/or demands. For example, telecommunications equipment manufacturers often undertake efforts to increase the bitrates of their telecommunications devices. To do so, these manufacturers may also need to increase the power consumption of their telecommunications devices. Such increased power consumption may involve and/or necessitate conductive paths capable of carrying higher amounts of current throughout corresponding circuit boards.

Some traditional circuit boards may include and/or necessitate various holes that facilitate connecting certain internal planes and/or layers (such as power planes, ground planes, and/or signal layers) to conductive contacts and/or traces on the top or bottom layers. Those holes may consume and/or occupy significant real estate on and/or within such circuit boards. Some of those holes may even combine with one another to form larger craters and/or openings, thereby potentially consuming and/or occupying more real estate on or within such circuit boards. This phenomenon is sometimes referred to as the "swiss cheese effect"—due to the resulting appearance of such combined holes.

Unfortunately, the swiss cheese effect may be responsible for limiting the amount of real estate available for conductive vias that facilitate connecting the internal power and/or ground planes to high-current devices mounted on the top and/or bottom layers of the circuit boards. As a result, those conductive vias may be unable to collectively support and/or carry the amount of current necessary to power certain high-current devices (e.g., certain next generation integrated circuits). The instant disclosure, therefore, identifies and addresses a need for apparatuses, systems, and methods for mitigating the swiss cheese effect in high-current circuit boards.

SUMMARY

As will be described in greater detail below, the instant disclosure generally relates to apparatuses, systems, and methods for mitigating the swiss cheese effect in high-current circuit boards. In one example, an apparatus for accomplishing such a task may be a circuit board that includes (1) a first unique sublaminate that includes a plurality of ground layers and a plurality of signal layers, (2) a second unique sublaminate that includes a plurality of power layers and another plurality of signal layers, and (3) a symmetry axis that bisects the circuit board between the first unique sublaminate and the second unique sublaminate, wherein the first unique sublaminate and the second unique sublaminate are distinct from one another.

Similarly, a system for accomplishing such a task may include (1) a circuit board that comprises (A) a first unique sublaminate that includes a plurality of ground layers and a plurality of signal layers, (B) a second unique sublaminate that includes a plurality of power layers and another plurality of signal layers, and (C) a symmetry axis that bisects the circuit board between the first unique sublaminate and the second unique sublaminate, wherein the first unique sublaminate and the second unique sublaminate are distinct from one another, and (2) an integrated circuit mounted atop the first unique sublaminate of the circuit board.

A corresponding method may include (1) sequentially laminating a first unique sublaminate of a circuit board that includes a plurality of ground layers and a plurality of signal layers, (2) sequentially laminating a second unique sublaminate of the circuit board that includes a plurality of power layers and another plurality of signal layers, and (3) stacking the first unique sublaminate of the circuit board atop the second unique sublaminate of the circuit board such that the ground layers included in the first unique sublaminate and the power layers included in the second unique sublaminate mirror each other relative to a symmetry axis that bisects the circuit board between the first unique sublaminate and the second unique sublaminate.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
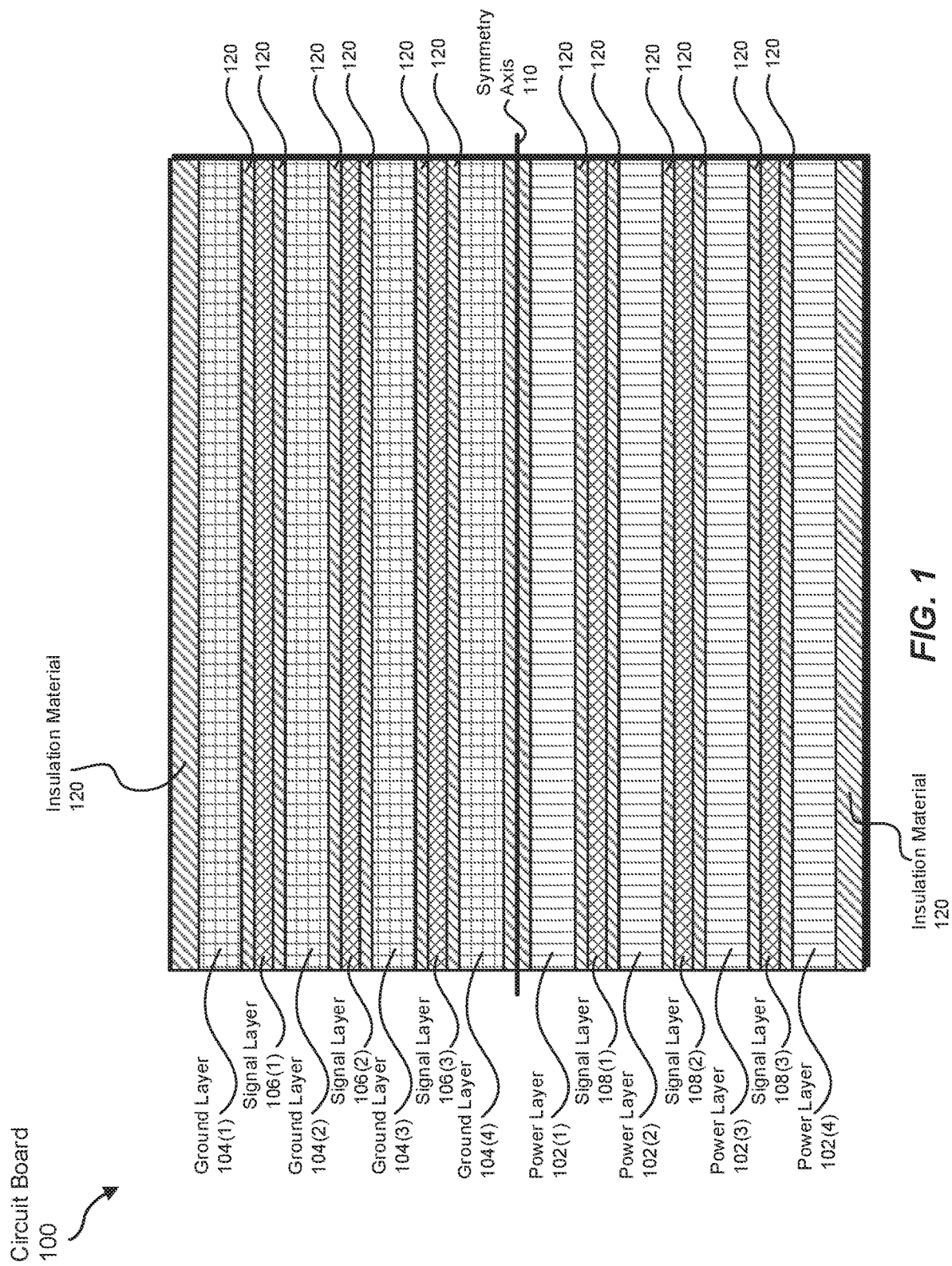
FIG. 1 is an illustration of an exemplary circuit board that mitigates and/or obviates the swiss cheese effect.

Throughout the drawings, identical reference characters and descriptions indicate similar, but not necessarily identical, elements. While the exemplary embodiments described herein are susceptible to various modifications and alternative forms, specific embodiments have been shown byway of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for mitigating the swiss cheese effect in high-current circuit boards. As will be explained in greater detail below, embodiments of the instant disclosure may provide designs and/or configurations of circuit boards that effectively reduce the number and/or length of vias needed to connect internal planes and/or layers (such as power planes, ground planes, and/or signal layers) to conductive contacts and/or traces on the top or bottom layers. In some embodiments, such circuit boards may include and/or represent two sublaminates coupled together. In these embodiments, such circuit boards may also include and/or represent a symmetry axis between the two sublaminates.

The two sublaminates may be similar or identical to one another in certain physical characteristics and/or attributes. For example, the two sublaminates may each include and/or represent the same number of planes or layers and/or the same sized planes or layers. Accordingly, such circuit boards may each represent and/or constitute a stack in which the two sublaminates effectively mirror each other relative to and/or across the symmetry axis. The mirrored sublaminates may be symmetrical with one another in terms of conductive material (e.g., copper).

However, the two sublaminates may be different or district from one another in certain physical and/or electrical characteristics or attributes. For example, such circuit boards may include and/or incorporate all the power planes and/or layers within one of the unique sublaminates and all the ground planes and/or layers within the other unique sublaminate. Additionally or alternatively, one sublaminate may include fewer drill holes and/or conductive vias than the other sublaminate. Accordingly, although the two sublaminates may share some physical characteristics and/or attributes in common, the two sublaminates may be distinguished from one another by other physical and/or electrical characteristics or attributes.

The following will provide, with reference to FIG. 1-5, detailed descriptions of exemplary components, apparatuses, systems, configurations, and/or implementations for mitigating the swiss cheese effect in high-current circuit boards. In addition, the discussion corresponding to FIG. 6 will provide a detailed description of an exemplary method for mitigating the swiss cheese effect in high-current circuit boards.

FIG. 1 illustrates an exemplary circuit board 100 that includes and/or represents various planes and/or layers that facilitate carrying and/or transferring electric current and/or signals. As illustrated in FIG. 1, exemplary circuit board 100 may include and/or represent ground layers 104(1), 104(2), 104(3), and/or 104(4). In some examples, circuit board 100 may also include and/or represent power layers 102(1), 102(2), 102(3), and/or 102(4). Additionally or alternatively, circuit board 100 may include and/or represent signal layers 106(1), 106(2), and/or 106(3) as well as signal layers 108(1), 108(2), and/or 108(3).

In some examples, circuit board 100 may include and/or contain a variety of materials. Some of these materials may conduct electricity. Other materials included in circuit board 100 may insulate the conductive materials from one another.

In some examples, circuit board 100 may include and/or incorporate various electrically conductive layers, such as ground layers 104(1)-(4), power layers 102(1)-(4), signal layers 106(1)-(3), and/or signal layers 108(1)-(3). In one example, each electrically conductive layer may include and/or represent a plane of conductive material that is etched during the fabrication phase to produce various conductive paths and/or traces throughout circuit board 100. In this example, the etched conductive paths and/or traces may be separated from and/or interconnected with one another as necessary to form one or more circuits that incorporate electrical components and/or electronics across circuit board 100. Examples of such electrically conductive materials include, without limitation, copper, aluminum, silver, gold, alloys of one or more of the same, combinations or variations of one or more of the same, and/or any other suitable materials.

In some examples, circuit board 100 may include and/or incorporate insulating material that facilitates mounting (e.g., mechanical support) and/or interconnection (e.g., electrical coupling) of electrical and/or electronic components. In one example, circuit board 100 may include and/or represent a PCB. Examples of circuit board 100 include, without limitation, multilayer boards, motherboards, linecards, backplanes, midplanes, and/or any other suitable type of circuit board. Various components may be laminated, etched, attached, and/or otherwise coupled to circuit board 100.

As illustrated in FIG. 1, circuit board 100 may include and/or represent insulation material 120 that electrically insulates all ground layers 104(1)-(4), power layers 102(1)-(4), signal layers 106(1)-(3), and/or signal layers 108(1)-(3) from one another. In some examples, insulation material 120 may be disposed, laid out, and/or applied as planes and/or layers between each of ground layers 104(1)-(4), power layers 102(1)-(4), signal layers 106(1)-(3), and/or signal layers 108(1)-(3). In such examples, insulation material 120 may constitute and/or represent a dielectric substance that is a poor conductor of electricity and/or is polarized by an applied electric field.

Dielectric substances may be implemented as solids, liquids, and/or gases. Examples of dielectric substances include, without limitation, porcelains, glasses, plastics, industrial coatings, silicon, germanium, gallium arsenide, mica, metal oxides, silicon dioxides, sapphires, aluminum oxides, polymers, ceramics, variations or combinations of one or more of the same, and/or any other suitable dielectric materials.

In some examples, circuit board 100 may be fabricated in any of a variety of ways, including sequential lamination. For example, as part of a sequential lamination process, circuit board 100 may be fabricated layer by layer, using certain subcomposites of copper and insulating materials. In this example, the sequential lamination process may facilitate trace routing and/or via drilling within internal planes and/or layers (such as ground layers 104(1)-(4), power layers 102(1)-(4), signal layers 106(1)-(3), and/or signal layers 108(1)-(3)).

As illustrated in FIG. 1, circuit board 100 may include and/or form a symmetry axis 110. In some examples, symmetry axis 110 may bisect circuit board 100 such that the top part of circuit board 100 and the bottom part of circuit board 100 effectively mirror each other. For example, ground layers 104(1)-(4) and power layers 102(1)-(4) may mirror one another relative to symmetry axis 110. More specifically, ground layer 104(4) and power layer 102(1) may mirror each other across symmetry axis 110, and ground layer 104(3) and power layer 102(2) may mirror each other across symmetry axis 110. Additionally or alternatively, ground layer 104(2) and power layer 102(3) may mirror each other across symmetry axis 110, and ground layer 104(1) and power layer 102(4) may mirror each other across symmetry axis 110.

In another example, signal layers 106(1)-(3) and signal layers 108(1)-(3) may mirror one another relative to symmetry axis 110. More specifically, signal layer 106(3) and signal layer 108(1) may mirror each other across symmetry axis 110, and signal layer 106(2) and signal layer 108(2) may mirror each other across symmetry axis 110. Additionally or alternatively, signal layer 106(1) and signal layer 108(3) may mirror each other across symmetry axis 110.

Figure 2:
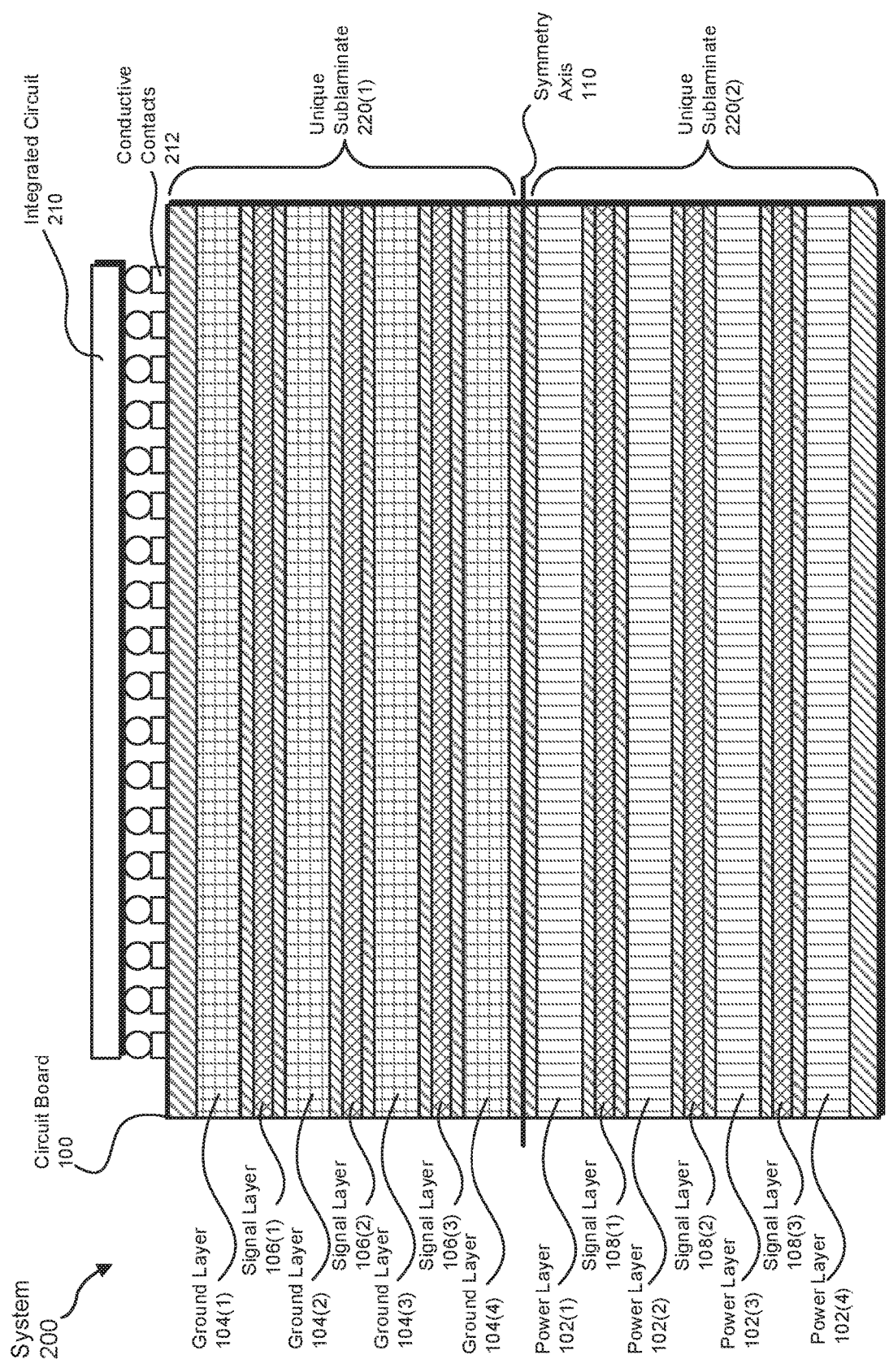
FIG. 2 is an illustration of an exemplary system for mitigating the swiss cheese effect in high-current circuit boards.

FIG. 2 illustrates an exemplary system 200 that includes and/or represents circuit board 100 and an integrated circuit 210. As illustrated in FIG. 2, integrated circuit 210 may be electrically coupled to and/or mounted atop circuit board 100. In some examples, integrated circuit 210 may include and/or represent one or more dies and/or chips on which one or more passive and/or active electronic components are implemented, disposed, etched, and/or deposited. Additionally or alternatively, such dies and/or chips may be electrically coupled and/or mounted to an internal substrate.

In this example, the passive and/or active electronic components may collectively form and/or serve as an Application Specific Integrated Circuit (ASIC) and/or a Systems on a Chip (SoC). Examples of such passive and/or active electronic components include, without limitation, processors, Field Programmable Gate Arrays (FPGAs), transistors, diodes, resistors, capacitors, inductors, transducers, sensors, antennas, resonators, switches, optical devices, conductors, traces, wires, combinations of one or more of the same, and/or any other suitable electronic components.

In one example, integrated circuit 210 may include and/or represent a small, diced piece of semiconductor material. For example, integrated circuit 210 may include and/or represent a silicon wafer. In this example, integrated circuit 210 may include and/or contain one or more circuits that consist of various passive and/or active components. These circuits may be etched into the semiconductor material.

Integrated circuit 210 may be of various shapes and/or dimensions. In some examples, integrated circuit 210 may form a square, a rectangle, and/or a cube. Additional examples of shapes formed by integrated circuit 210 include, without limitation, ovals, circles, variations or combinations of one or more of the same, and/or any other suitable shapes.

Integrated circuit 210 may be sized in a particular way to fit within a certain electrical component of a computing device. Integrated circuit 210 may include and/or contain any of a variety of materials.

As illustrated in FIG. 2, integrated circuit 210 may also include and/or incorporate a plurality of electrical contacts that facilitate electrical couplings. In some examples, such electrical contacts may be disposed on, along, and/or through integrated circuit 210. In one example, such electrical contacts may include and/or represent a set of high-density of Land Grid Array (LGA) pads. In another example, such electrical contacts may include and/or represent a set of high-density of Ball Grid Array (BGA) pads.

As illustrated in FIG. 2, circuit board 100 may include and/or represent unique sublaminates 220(1) and 220(2) that mirror one another relative to and/or across symmetry axis 110. In some examples, unique sublaminate 220(1) may include and/or represent ground layers 104(1)-(4) as well as signal layers 106(1)-(3). In one example, ground layers 104(1)-(4) and signal layers 106(1)-(3) may be arranged, laid out, and/or disposed in an alternating configuration within unique sublaminate 220(1). In this example, the alternating configuration may entail and/or involve positioning or placing a signal layer between every set of two ground layers within unique sublaminate 220(1). Similarly, the alternating configuration may entail and/or involve positioning or placing a ground layer between every set of two signal layers within unique sublaminate 220(1).

In some examples, unique sublaminate 220(2) may include and/or represent power layers 102(1)-(4) as well as signal layers 108(1)-(3). In one example, power layers 102(1)-(4) and signal layers 108(1)-(3) may be arranged, laid out, and/or disposed in an alternating configuration within unique sublaminate 220(2). In this example, the alternating configuration may entail and/or involve positioning or placing a signal layer between every set of two power layers within unique sublaminate 220(2). Similarly, the alternating configuration may entail and/or involve positioning or placing a power layer between every set of two signal layers within unique sublaminate 220(2).

Figure 3:
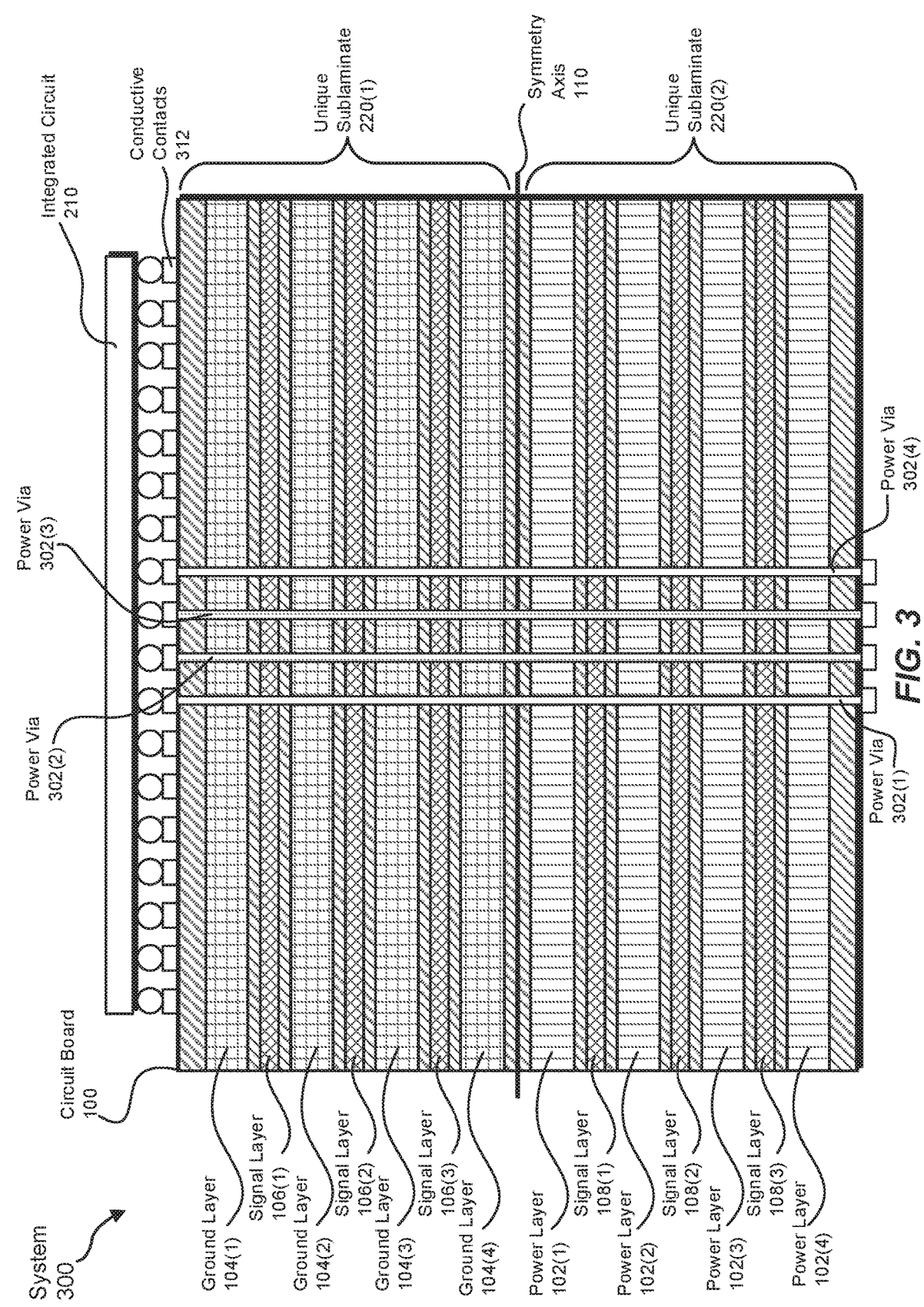
FIG. 3 is an illustration of an additional exemplary system for mitigating the swiss cheese effect in high-current circuit boards.

FIG. 3 illustrates an exemplary system 300 that includes and/or represents circuit board 100 and integrated circuit 210. Exemplary system 300 in FIG. 3 may include and/or represent an implementation, extension, and/or expansion of system 200 in FIG. 2. As illustrated in FIG. 3, integrated circuit 210 may be electrically coupled to and/or mounted atop unique sublaminate 220(1) of circuit board 100. In some examples, unique sublaminates 220(1) and 220(2) may be similar or identical to one another in certain physical characteristics and/or attributes. For example, unique sublaminates 220(1) and 220(2) may each include and/or represent the same number of planes or layers and/or the same sized planes or layers. More specifically, ground layers 104(1)-(4) and power layers 102(1)-(4) may each be of the same size and/or dimensions (e.g., width, thickness, etc.). In one example, unique sublaminates 220(1) and 220(2) may be symmetrical with one another in terms of conductive material (e.g., copper). In other words, the conductive material disposed and/or incorporated in circuit board 100 may be balanced between unique sublaminates 220(1) and 220(2), especially directly underneath integrated circuit 210.

However, unique sublaminates 220(1) and 220(2) may be different or district from one another in certain physical and/or electrical characteristics or attributes. For example, unique sublaminate 220(2) may include and/or incorporate all the power planes and/or layers of circuit board 100. Accordingly, unique sublaminate 220(1) may exclude and/or omit all power planes and/or layers of circuit board 100. In other words, unique sublaminate 220(1) may be devoid of power planes and/or layers.

In another example, unique sublaminate 220(1) may include and/or incorporate all the ground planes and/or layers of circuit board 100. Accordingly, unique sublaminate 220(2) may exclude and/or omit all ground planes and/or layers of circuit board 100. In other words, unique sublaminate 220(2) may be devoid of ground planes and/or layers.

As illustrated in FIG. 3, circuit board 100 may include and/or incorporate power vias 302(1), 302(2), 302(3), and/or 302(4). In some examples, power vias 302(1)-(4) may span and/or run across unique sublaminates 220(1) and 220(2) to provide electrical conductivity and/or continuity from power layers 102(1)-(4) to integrated circuit 210 mounted atop unique sublaminate 220(1).

In some examples, power vias 302(1)-(4) may carry and/or transfer power and/or electric current from power layers 102(1)-(4) of unique sublaminate 220(2) to integrated circuit 210 mounted atop unique sublaminate 220(1). In one example, power vias 302(1)-(4) may each include and/or represent a drilled hole that has been partially plated with electrically conductive material to create and/or form a conductive path and/or bridge from one or more of power layers 102(1)-(4) to integrated circuit 210. In this example, power vias 302(1)-(4) may be insulated from ground layers 104(1)-(4), signal layers 106(1)-(3), and/or signal layers 108(1)-(3). Accordingly, power vias 302(1)-(4) may fail to provide direct electrical conductivity and/or continuity to ground layers 104(1)-(4), signal layers 106(1)-(3), and/or signal layers 108(1)-(3).

As illustrated in FIG. 3, circuit board 100 may include and/or incorporate a plurality of conductive contacts 312 atop unique sublaminate 220(1). In some examples, conductive contacts 312 may facilitate electrical couplings (by way of, e.g., soldering) between integrated circuit 210 and one or more of ground layers 104(1)-(4), power layers 102(1)-(4), signal layers 106(1)-(3), and/or signal layers 108(1)-(3). In one example, conductive contacts 312 may be disposed on, along, and/or through unique sublaminate 220(1) of circuit board 100. In this example, conductive contacts 312 may include and/or represent a set of high-density of LGA pads. Additionally or alternatively, conductive contacts 312 may include and/or represent a set of high-density of BGA pads.

Figure 4:
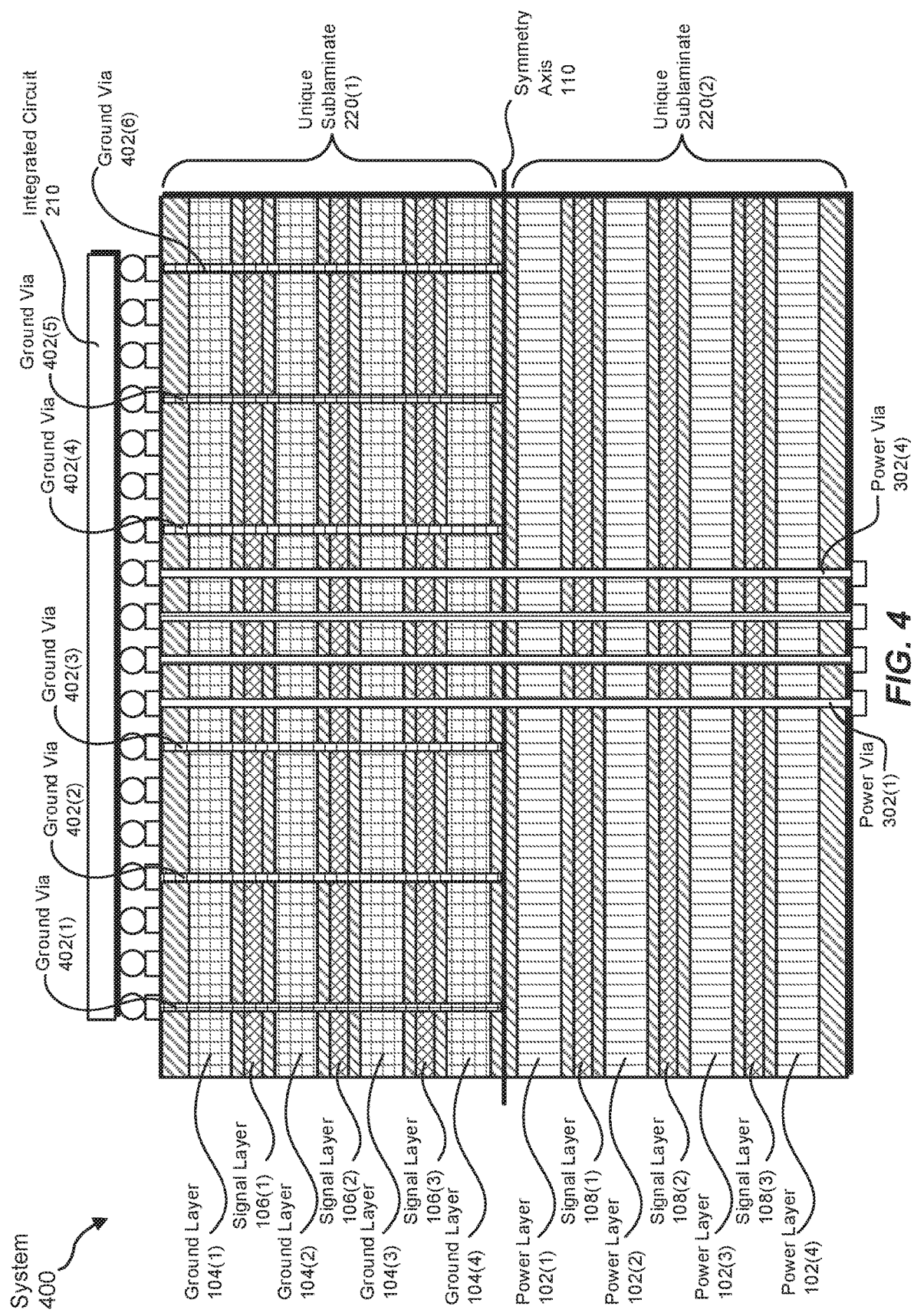
FIG. 4 is an illustration of an additional exemplary system for mitigating the swiss cheese effect in high-current circuit boards.

FIG. 4 illustrates an exemplary system 400 that includes and/or represents circuit board 100 and integrated circuit 210. Exemplary system 400 in FIG. 4 may include and/or represent an implementation, extension, and/or expansion of system 300 in FIG. 3. As illustrated in FIG. 4, circuit board 100 of exemplary system 400 may include and/or incorporate ground vias 402(1), 402(2), 402(3), 402(4), 402(5), and/or 402(6). In some examples, ground vias 402(1)-(6) may span and/or run across unique sublaminate 220(1) to provide electrical conductivity and/or continuity from integrated circuit 210 mounted atop unique sublaminate 220(1) to ground layers 104(1)-(4).

In some examples, ground vias 402(1)-(6) may carry and/or transfer power and/or electric current from integrated circuit 210 to one or more of ground layers 104(1)-(4) of unique sublaminate 220(1). In one example, ground vias 402(1)-(6) may each include and/or represent a drilled hole that has been partially plated with electrically conductive material to create and/or form a conductive path and/or bridge from integrated circuit 210 to one or more of ground layers 104(1)-(4). In this example, ground vias 402(1)-(6) may be insulated from power layers 102(1)-(4), signal layers 106(1)-(3), and/or signal layers 108(1)-(3). Accordingly, ground vias 402(1)-(6) may fail to provide direct electrical conductivity and/or continuity to power layers 102(1)-(4), signal layers 106(1)-(3), and/or signal layers 108(1)-(3).

In some examples, ground vias 402(1)-(6) may be shorter and/or smaller than power vias 302(1)-(4). For example, ground vias 402(1)-(6) may terminate within unique sublaminate 220(1) and/or at symmetry axis 110, as opposed to spanning both of unique sublaminates 220(1) and 220(2) like power vias 302(1)-(4). In this example, the drilled holes that form ground vias 402(1)-(6) may be limited to unique sublaminate 220(1) and/or may fail to reach and/or penetrate unique sublaminate 220(2). Accordingly, system 400 in FIG. 4 may effectively reduce the number and/or length of vias needed to connect the internal planes and/or layers (such as ground planes) of circuit board 100 to conductive contacts and/or traces on the top or bottom layers of circuit board 100. By doing so, system 400 may be able to mitigate the swiss cheese effect in circuit board 100.

Figure 5:
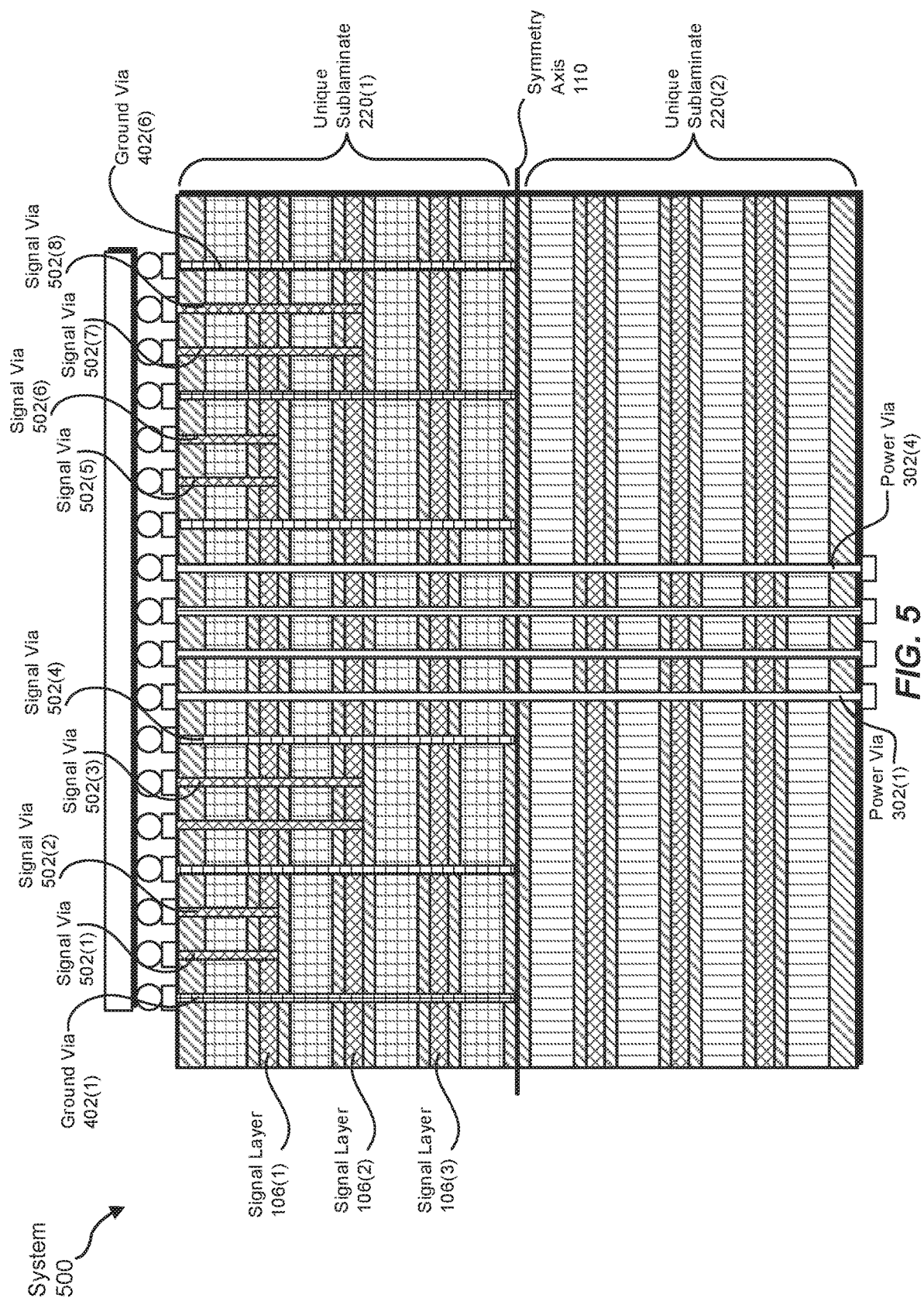
FIG. 5 is an illustration of an additional exemplary system for mitigating the swiss cheese effect in high-current circuit boards.

FIG. 5 illustrates an exemplary system 500 that includes and/or represents circuit board 100 and integrated circuit 210. Exemplary system 500 in FIG. 5 may include and/or represent an implementation, extension, and/or expansion of system 400 in FIG. 4. As illustrated in FIG. 5, circuit board 100 of exemplary system 500 may include and/or incorporate signal vias 502(1), 502(2), 502(3), 502(4), 502(5), 502(6), 502(7) and/or 502(8). In some examples, signal vias 502(1)-(8) may span and/or run across unique sublaminate 220(1) to provide electrical conductivity and/or continuity from integrated circuit 210 mounted atop unique sublaminate 220(1) to signal layers 106(1)-(3).

In some examples, signal vias 502(1)-(8) may carry and/or transfer electrical signals between integrated circuit 210 and one or more signal layers 106(1)-(3) of unique sublaminate 220(1). In one example, signal vias 502(1)-(8) may each include and/or represent a drilled hole that has been partially plated with electrically conductive material to create and/or form a conductive path and/or bridge from integrated circuit 210 to one or more of signal layers 106(1)-(3). In this example, signal vias 502(1)-(8) may be insulated from ground layers 104(1)-(4), power layers 102(1)-(4), and/or signal layers 108(1)-(3). Accordingly, signal vias 502(1)-(8) may fail to provide direct electrical conductivity and/or continuity to ground layers 104(1)-(4), power layers 102(1)-(4), and/or signal layers 108(1)-(3).

In some examples, signal vias 502(1)-(8) may be shorter and/or smaller than power vias 302(1)-(4) and/or ground vias 402(1)-(6). For example, signal vias 502(1)-(8) may terminate within unique sublaminate 220(1) and/or at symmetry axis 110, as opposed to spanning both of unique sublaminates 220(1) and 220(2) like power vias 302(1)-(4). In this example, the drilled holes that form signal vias 502(1)-(8) may be limited to unique sublaminate 220(1) and/or may fail to reach and/or penetrate unique sublaminate 220(2). Accordingly, system 500 in FIG. 5 may effectively reduce the number and/or length of vias needed to connect the internal planes and/or layers (such as ground planes and/or signal layers) of circuit board 100 to conductive contacts and/or traces on the top or bottom layers of circuit board 100. By doing so, system 500 may be able to mitigate the swiss cheese effect in circuit board 100.

In some examples, additional signal vias may be included and/or incorporated into circuit board 100. For example, circuit board 100 may include and/or incorporate one or more additional signal vias that span and/or run from signal layers 108(1)-(3) included in unique sublaminate 220(2) to one or more conductive contacts and/or traces positioned either atop unique sublaminate 220(1) or beneath unique sublaminate 220(2). In one example, such additional signal vias may carry and/or transfer electrical signals to or from integrated circuit 210. In this example, such additional signal vias may emerge from unique sublaminate 220(1) outside the footprint and/or area of integrated circuit 210 to avoid further congesting that area of circuit board 100 and/or complicating or exacerbating the swiss cheese effect. Additionally or alternatively, such additional signal vias may carry and/or transfer electrical signals to or from other electrical components or devices (not necessarily illustrated in FIGS. 1-5) coupled and/or mounted to circuit board 100.

Figure 6:
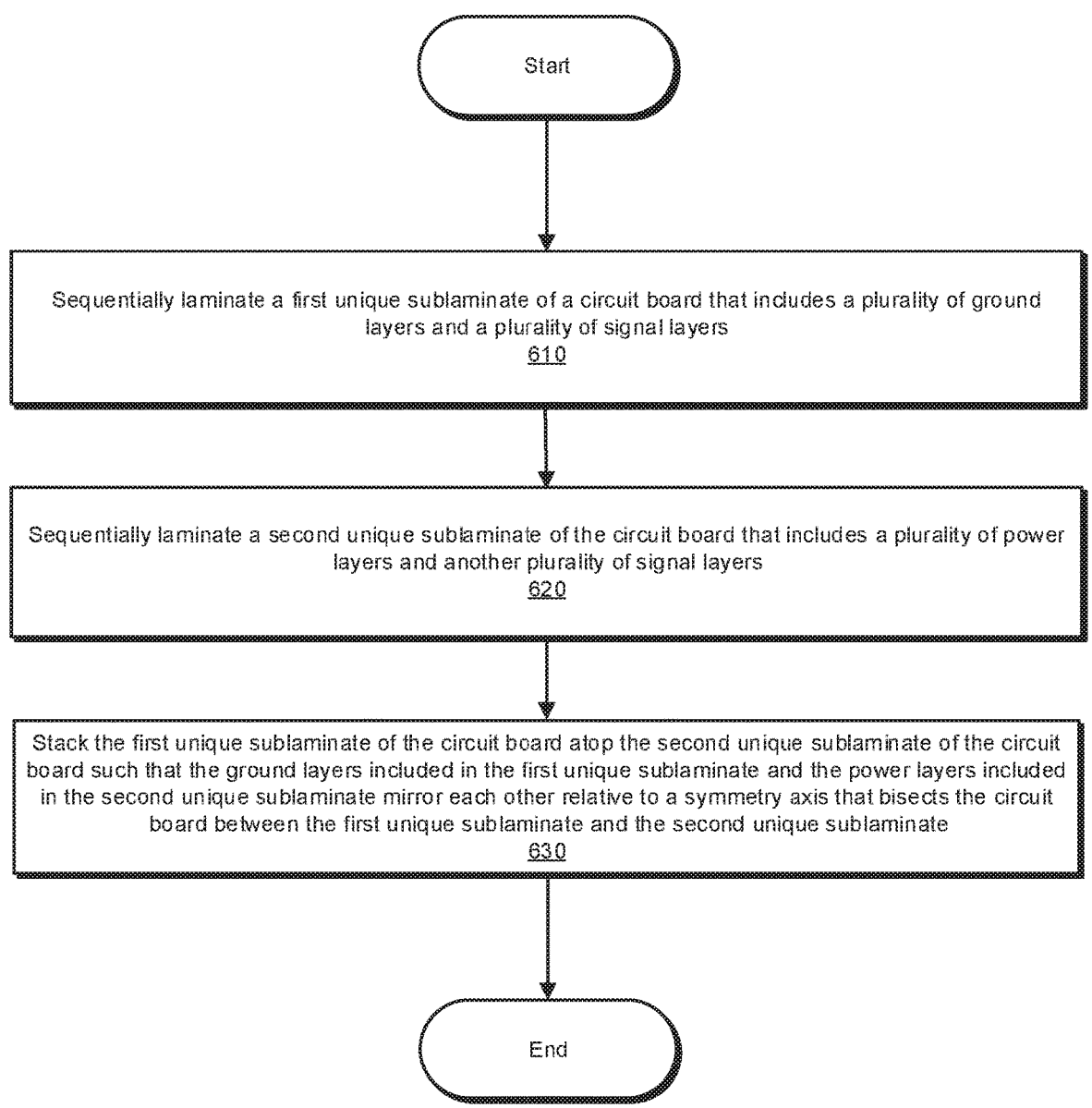
FIG. 6 is a flow diagram of an exemplary method for mitigating the swiss cheese effect in high-current circuit boards.

FIG. 6 is a flow diagram of an exemplary method 600 for mitigating the swiss cheese effect in high-current circuit boards. Method 600 may include the step of sequentially laminating a first unique sublaminate of a circuit board that includes a plurality of ground layers and a plurality of signal layers (610). Step 610 may be performed in a variety of ways, including any of those described above in connection with FIGS. 1-5. For example, a computing equipment manufacturer or subcontractor may fabricate and/or manufacture a circuit board. In this example, as part of the fabrication and/or manufacturing process, the computing equipment manufacturer or subcontractor may sequentially laminate a first unique sublaminate of a circuit board that includes a plurality of ground layers and a plurality of signal layers.

Method 600 may also include the step of sequentially laminating a second unique sublaminate of the circuit board that includes a plurality of power layers and another plurality of signal layers (620). Step 620 may be performed in a variety of ways, including any of those described above in connection with FIGS. 1-5. For example, as part of the fabrication and/or manufacturing process, the computing equipment manufacturer or subcontractor may sequentially laminate a second unique sublaminate of the circuit board that includes a plurality of power layers and another plurality of signal layers.

Method 600 may further include the step of stacking the first unique sublaminate of the circuit board atop the second unique sublaminate of the circuit board such that the ground layers included in the first unique sublaminate and the power layers included in the second unique sublaminate mirror each other relative to a symmetry axis that bisects the circuit board between the first unique sublaminate and the second unique sublaminate (630). Step 630 may be performed in a variety of ways, including any of those described above in connection with FIGS. 1-5. For example, as part of the fabrication and/or manufacturing process, the computing equipment manufacturer or subcontractor may stack the first unique sublaminate of the circuit board atop the second unique sublaminate of the circuit board such that the ground layers included in the first unique sublaminate and the power layers included in the second unique sublaminate mirror each other relative to a symmetry axis that bisects the circuit board between the first unique sublaminate and the second unique sublaminate.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A circuit board comprising:
  a first unique sublaminate that includes a plurality of ground layers and a plurality of signal layers;
  a second unique sublaminate that includes a plurality of power layers and another plurality of signal layers;
  a symmetry axis that bisects the circuit board between the first unique sublaminate and the second unique sublaminate, wherein:
  the first unique sublaminate and the second unique sublaminate are distinct from one another, wherein the first unique sublaminate does not include any power layers;
  the ground layers included in the first unique sublaminate and the power layers included in the second unique sublaminate mirror each other relative to the symmetry axis; and
  the first unique sublaminate is stacked atop the second unique sublaminate such that all of the plurality of ground layers is stacked atop the plurality of power layers;
  an integrated circuit mounted atop the first unique sublaminate;
  one or more ground vias that:
  span across the first unique sublaminate to provide conductivity from the integrated circuit mounted atop the first unique sublaminate to the ground layers included in the first unique sublaminate; and
  terminate within the first unique sublaminate to avoid reaching the second unique sublaminate and to avoid penetrating any of the plurality of power layers; and
  one or more power vias that span across the first unique sublaminate and the second unique sublaminate to provide conductivity from the power layers included in the second unique sublaminate to the integrated circuit mounted atop the first unique sublaminate.

2. The circuit board of claim 1, wherein the signal layers included in the first unique sublaminate and the signal layers included in the second unique sublaminate mirror each other relative to the symmetry axis.

3. The circuit board of claim 1, wherein:
  the ground layers included in the first unique sublaminate are of a certain number; and
  the power layers included in the second unique sublaminate are of the certain number.

4. The circuit board of claim 1, wherein:
  the signal layers included in the first unique sublaminate are of a certain number; and
  the signal layers included in the second unique sublaminate are of the certain number.

5. The circuit board of claim 1, further comprising one or more signal vias that each span from one of the signal layers included in the first unique sublaminate and a conductive contact coupled to the integrated circuit mounted atop the first unique sublaminate.

6. The circuit board of claim 1, further comprising one or more signal vias that each span from one of the signal layers included in the second unique sublaminate to a conductive contact positioned either atop the first unique sublaminate or beneath the second unique sublaminate.

7. The circuit board of claim 1, wherein:
  the first unique sublaminate is devoid of power layers; and
  the second unique sublaminate is devoid of ground layers.

8. The circuit board of claim 1, wherein:
  the ground layers and the signal layers included in the first unique sublaminate are arranged in an alternating configuration; and the power layers and the signal layers included in the second unique sublaminate are arranged in the alternating configuration.

9. A system comprising:
a circuit board that comprises:
a first unique sublaminate that includes a plurality of ground layers and a plurality of signal layers;
a second unique sublaminate that includes a plurality of power layers and another plurality of signal layers; and
a symmetry axis that bisects the circuit board between the first unique sublaminate and the second unique sublaminate, wherein:
the first unique sublaminate and the second unique sublaminate are distinct from one another, wherein the first unique sublaminate does not include any power layers;
the ground layers included in the first unique sublaminate and the power layers included in the second unique sublaminate mirror each other relative to the symmetry axis; and
the first unique sublaminate is stacked atop the second unique sublaminate such that all of the plurality of ground layers is stacked atop the plurality of power layers;
an integrated circuit mounted atop the first unique sublaminate of the circuit board;
one or more ground vias that:
span across the first unique sublaminate to provide conductivity from the integrated circuit mounted atop the first unique sublaminate to the ground layers included in the first unique sublaminate; and
terminate within the first unique sublaminate to avoid reaching the second unique sublaminate and to avoid penetrating any of the plurality of power layers; and
one or more power vias that span across the first unique sublaminate and the second unique sublaminate to provide conductivity from the power layers included in the second unique sublaminate to the integrated circuit mounted atop the first unique sublaminate.

10. The system of claim 9, wherein the signal layers included in the first unique sublaminate and the signal layers included in the second unique sublaminate mirror each other relative to the symmetry axis.

11. The system of claim 9, wherein:
the ground layers included in the first unique sublaminate are of a certain number; and
the power layers included in the second unique sublaminate are of the certain number.

12. The system of claim 9, wherein:
the signal layers included in the first unique sublaminate are of a certain number; and
the signal layers included in the second unique sublaminate are of the certain number.

13. A method comprising:
sequentially laminating a first unique sublaminate of a circuit board that includes a plurality of ground layers and a plurality of signal layers;
sequentially laminating a second unique sublaminate of the circuit board that includes a plurality of power layers and another plurality of signal layers;
stacking the first unique sublaminate of the circuit board atop the second unique sublaminate of the circuit board such that the ground layers included in the first unique sublaminate and the power layers included in the second unique sublaminate mirror each other relative to a symmetry axis that bisects the circuit board between the first unique sublaminate and the second unique sublaminate, wherein:
the first unique sublaminate does not include any power layers; and
all of the plurality of ground layers is stacked atop the plurality of power layers;
mounting an integrated circuit atop the first unique sublaminate;
incorporating, into the circuit board, one or more ground vias that:
span across the first unique sublaminate to provide conductivity from the integrated circuit mounted atop the first unique sublaminate to the ground layers included in the first unique sublaminate; and
terminate within the first unique sublaminate to avoid reaching the second unique sublaminate and to avoid penetrating any of the plurality of power layers;
incorporating, into the circuit board, one or more power vias that span across the first unique sublaminate and the second unique sublaminate to provide conductivity from the power layers included in the second unique sublaminate to the integrated circuit mounted atop the first unique sublaminate.

14. The circuit board of claim 1, wherein the second unique sublaminate does not include any ground layers.

* * * * *